US005109174A

United States Patent [19]
Shewell

[11] Patent Number: 5,109,174
[45] Date of Patent: Apr. 28, 1992

[54] ULTRASONIC CLEANER

[75] Inventor: Robert E. Shewell, Rochester, N.Y.
[73] Assignee: MDT Corporation, Torrance, Calif.

[21] Appl. No.: 440,988
[22] Filed: Nov. 22, 1989
[51] Int. Cl.[5] .......... H01L 41/08
[52] U.S. Cl. .......... 310/317; 310/316
[58] Field of Search .......... 310/316, 317, 334; 318/116, 118

[56] References Cited

U.S. PATENT DOCUMENTS

| | | | |
|---|---|---|---|
| 2,489,860 | 11/1949 | Carlin | 310/317 X |
| 3,371,233 | 2/1968 | Cook | 310/317 X |
| 3,638,087 | 1/1972 | Ratcliff | 310/316 |
| 4,319,155 | 3/1982 | Nakai et al. | 310/317 X |
| 4,398,925 | 8/1983 | Trinh et al. | 55/15 |
| 4,455,063 | 4/1984 | Smith | 310/317 X |
| 4,501,151 | 2/1985 | Christman | 73/646 |
| 4,544,477 | 11/1985 | Ratcliff | 310/317 X |
| 4,559,826 | 12/1985 | Nelson | 310/317 X |
| 4,736,130 | 4/1988 | Puskas | 310/317 X |
| 4,864,547 | 9/1989 | Krsna | 310/317 |

FOREIGN PATENT DOCUMENTS 1572186 7/1980 United Kingdom .

OTHER PUBLICATIONS

A Programable Pulse Generator for Piezoelectric Multielement Transducers, Certo et al., *Ultrasonics*, Jul. 1984 pp. 163-166. (copy in 310/317).

*Primary Examiner*—Mark O. Budd
*Attorney, Agent, or Firm*—Trask, Britt & Rossa

[57] ABSTRACT

An improved ultrasonic cleaner is disclosed. Transducers are attached to a tank to vibrate liquid within the tank. A drive circuit is linked with the transducers to cause the transducers to oscillate at ultrasonic frequencies. The drive circuit includes an oscillator and a counter. The oscillator produces an ultrasonic signal. The counter divides the ultrasonic signal and feeds divided signals back into the oscillator to modulate the amplitude of the ultrasonic signal within a square-wave envelope and to step the frequency of the ultrasonic signal at discrete values about the center frequency.

18 Claims, 2 Drawing Sheets

ULTRASONIC CLEANER

BACKGROUND OF THE INVENTION

1. Field

The present invention is directed toward an improved ultrasonic cleaner, and particularly one providing amplitude and frequency modulation of ultrasonic vibrations.

2. State of the Art

In ultrasonic cleaners, articles to be cleaned are placed in a liquid bath in a cleaning tank. A piezoelectric transducer is mounted to the tank to convert electrical energy into mechanical vibrations in the water. An ultrasonic signal generated by a driver circuit energizes the transducers to vibrate at their prescribed frequency, which is preferably a resonant frequency of the particular transducers used.

It is known that the efficiency of ultrasonic cleaners can be improved by modulating the amplitude or the frequency of the ultrasonic signal presented to the transducers. Without modulation, standing waves may occur within the tank, allowing for uneven cleaning.

Amplitude modulation is typically accomplished by deriving a modulation signal from the frequency of the AC line voltage that powers the ultrasonic cleaner. This modulation signal is presented to the transducers to modulate the amplitude of the ultrasonic signal within the "envelope" of the derived modulation signal. In the United States, 120 volt, 60 Hz, AC line voltage is common. In Europe, 240 volt, 50 Hz AC line voltage is the norm. The amplitude modulation signal is typically derived by a full wave rectification of the power line voltage. Thus, in the United States, amplitude modulation typically occurs within a 120 Hz envelope, while in Europe, amplitude modulation occurs within a 100 Hz envelope.

The modulation envelope provided by the AC line voltage is generally sinusoidal. When the sinusoidal signal is full wave rectified, the lower half of the sine wave signal is "flipped up" to the positive voltage side. As viewed on an oscilloscope, the amplitude envelope signal looks like a series of "bumps" with zero volt nodes between the bumps.

The modulation signals of such devices are chosen because they are easily derived from available line voltage. However, it appears that neither the frequency nor the shape of modulation signals derived from common line voltages are optimum for achieving maximum efficiency in ultrasonic cleaners. There remains a need for an ultrasonic cleaner having a drive circuit that provides for amplitude and frequency modulation and signal shaping chosen to maximize cleaning effectiveness and transducer output, independent from the frequency and signal shape of available line voltage.

SUMMARY OF THE INVENTION

The present invention provides an ultrasonic cleaner comprising a tank adapted to receive liquid and articles to be cleaned. A transducer is mounted to the tank and is adapted to transfer ultrasonic vibrations to the liquid based upon an ultrasonic signal. An oscillator is linked with the transducer and is adapted to produce an ultrasonic signal at a center frequency. Amplitude modulation means is linked with the oscillator for modulating the amplitude of the ultrasonic signal at a modulation frequency that is independent of the frequency of AC line voltage. Frequency modulation means is linked with the oscillator for modulating the frequency of the ultrasonic signal about the center frequency.

In one embodiment, the amplitude modulation means produces a square-wave envelope signal within which the amplitude of the ultrasonic signal is modulated. The frequency of the envelope signal is preferably synchronous with the frequency of the ultrasonic signal. The frequency modulation means may be adapted to step the frequency of the ultrasonic signal among discrete frequencies about the center frequency. The ultrasonic signal may itself be a square-wave signal.

The invention also provides a drive circuit for driving a transducer in an ultrasonic cleaner. The drive circuit comprises an oscillator adapted to produce an ultrasonic signal at a preselected center frequency. Amplitude modulation means is linked with the oscillator for modulating the amplitude of the ultrasonic signal within an amplitude envelope signal having a frequency independent from any AC line voltage. Frequency control means is linked with the oscillator for stepping the ultrasonic frequency between discrete frequencies about the center frequency.

The modulation envelope signal is preferably a square-wave signal. The frequency control means is preferably a counter that is adapted to produce a frequency modulation signal and to deliver the frequency modulation signal to the oscillator. The ultrasonic signal is preferably a square-wave signal.

DETAILED DESCRIPTION OF THE ILLUSTRATED EMBODIMENT

Figure 1:
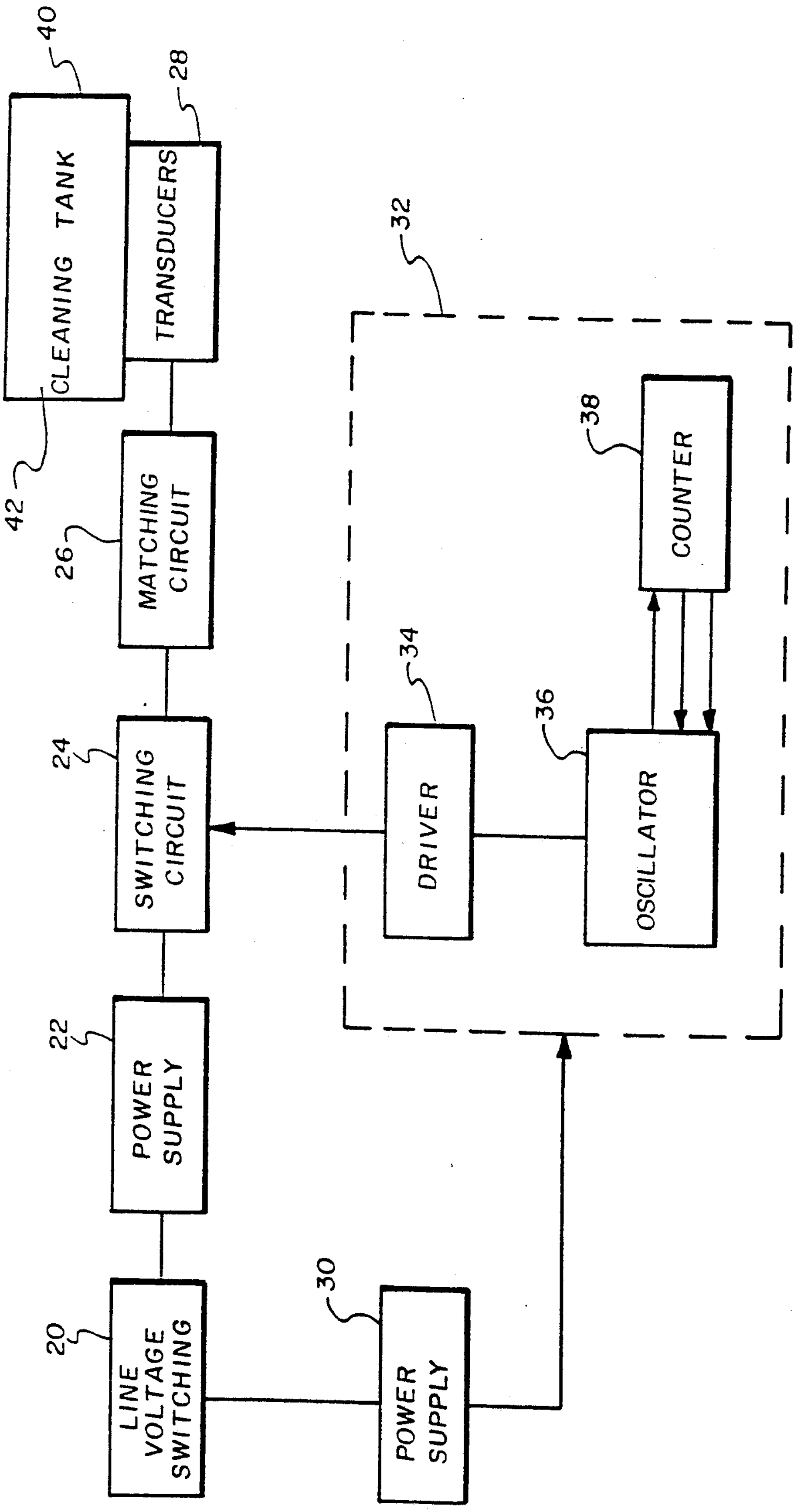
FIG. 1 is a block diagram of an ultrasonic cleaner of the invention.

Referring to FIG. 1, an ultrasonic cleaner of the invention includes a line voltage switching circuit 20, power supply 22, switching circuit 24, matching circuit 26, transducers 28, power supply 30, modulator circuit 32. (including driver 34, oscillator 36, and counter 38), and cleaning tank 40. Cleaning tank 40 contains a cleaning liquid 42.

Line voltage switching circuit 20 allows the ultrasonic cleaner to operate on available line voltages, e.g., either 120 volt AC current or 240 volt AC current. Power supply 22 obtains from line voltage switching 20 appropriate power to drive transducers 28. Switching circuit 24 is adapted to switch transducers 28 on and off based on an ultrasonic signal received from driver 34. Matching circuit 26 matches the switching oscillation of switching circuit 24 directly to transducers 28 to cause transducers 28 to vibrate liquid 42 held in ultrasonic cleaning tank 40 at ultrasonic frequencies.

Power supply 30 provides appropriate low voltage power to modulator circuit 32. Modulator circuit 32 contains integrated circuitry operating on standard 5 volt logic. Oscillator 36 and counter 38 interact to produce an ultrasonic signal to driver 34 that has a center frequency and that is modulated in both its amplitude and frequency. Driver 34 in turn delivers this signal to switching circuit 24.

Figure 2:
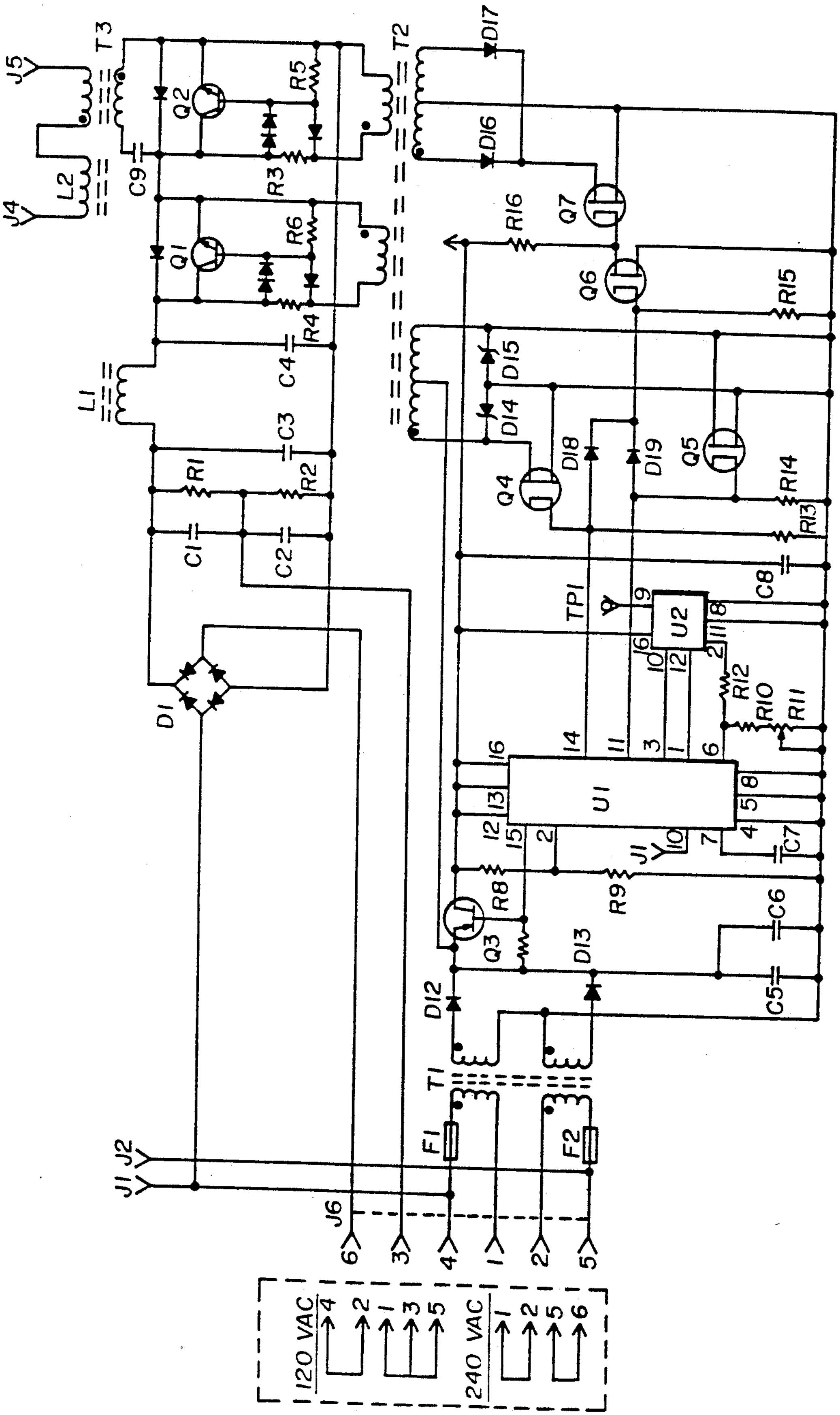
FIG. 2 is a schematic circuit diagram of a driver board for transducers 28 of FIG. 1.

Table 1 sets forth a list of components used in the driver board illustrated in FIG. 2.

TABLE 1

| Part | Type |
|---|---|
| D1 | Bridge |
| Q1,Q2 | 2N6673 |
| Q3 | MJE171 |
| Q4-Q7 | VN10KM |
| U1 | SG3524 |
| U2 | CD4020B |
| D12,13 | 1N4004 |
| D16-20 | 1N914 |
| D14,15 | 1N4753 |
| L2 | V-152 |
| L1 | V-151 |
| T3 | CUSTOM |
| T2 | CUSTOM |
| T1 | PSD4-28 |
| C1,C2 | 470 mF/200 V |
| C4,C9 | 2.2 mF/400 V |
| C3 | .1 mF/500 V |
| C5 | 470 mF/25 V |
| C7 | 4700 pF/100 V |
| C8 | 22 mF/10 V |
| C6 | 1 mF/50 V |
| R3,R4 | 2.7 OHM ½W |
| R5,R6 | 10 OHM ¼W |
| R1,R2 | 100K ½W |
| R7 | 22 OHM ¼W |
| R8,R9 | 4.7K ¼W |
| R12 | 1 MEG ¼W |
| R13-16 | 1K ¼W |
| R10 | 2K ¼W |
| R11 | 2K TRIMPOT |
| F1,F2 | ⅛A FUSE |

Note:
unlabeled diodes are 1N4937 1 amp fast recovery.

Referring to FIG. 2, at the left side of the figure, a line voltage switching circuit 20 includes junction J6. Junction J6 is a programming plug that allows the user to select between 120 volt AC line voltage or 240 volt AC line voltage. If 120 volt AC is selected, the upper plug labeled 120 VAC is connected to junction J6 to connect pin 2 to pin 4 and to connect pins 1, 3, and 5. If 240 volts is to be selected, the lower plug labeled 240 VAC is connection to junction J6 to connect pin 1 to pin 2 and to connect pin 5 and pin 6.

Diode bank D1 acts as a rectifier. With the incoming voltage from J6 at 120 volts AC, diode bank D1 acts as a full wave doubler, doubling the incoming voltage. With the incoming voltage from junction J6 at 240 volts, diode bank D1 acts as a full wave bridge rectifier. Capacitors C1, C2, C3, and C4, resistors R1 and R2, and inductor L1 serve to additionally filter the signal incoming from junction J6. Diode bank D1, capacitors C1 through C4, resistors R1 and R2, and inductor L1 thus function as a power supply 22.

Switching circuit 24 includes transistors Q1 and Q2. Transistors Q1 and Q2 are adapted to be turned on and off alternately. In other words, when Q1 is on, Q2 is off. When Q2 is on, Q1 is off. Resistors R3, R4, R5 and R6 and the associated diodes aid transistors Q1 and Q2 in their switching functions.

Matching circuit 26 includes transformer T3. Transformer T3 steps the voltage down to an appropriate level for transducers 28 connected at junctions J4 and J5. Inductor L2 tunes out capacitive reactance of transducers 28 so that the transducers 28 appear to the circuitry as a resistive rather than a capacitive load. Capacitor C9 is an AC coupling capacitor.

The illustrated ultrasonic cleaner thus provides the capability for multi-voltage use. In other known ultrasonic cleaners, a rectified line voltage signal is used to modulate the amplitude of the ultrasonic signal. For safety reasons, in such cleaners, a large transformer must be used to isolate the transducers and cleaning tank from the AC line. However, in the illustrated ultrasonic cleaner, the small high-frequency transformers $T_2$ and $T_3$ provide for effective current isolation of the cleaning tank and transducers from the AC line voltage.

Power supply 30 includes transformer T1. Transformer T1 with its associated diodes, capacitors, and resistors provide the appropriate voltage for the integrated circuits U1 and U2 to operate.

As shown in the parts list, supra, U1 is an SG3524 controller. U2 is a CD4020B counter. U1 and U2 are connected at the pin connections shown. U1 contains an oscillator. The oscillating frequency of U1 is controlled by the resistors and capacitors connected at pins 6 and 7 of U1. Junction J1 is connected to pin 10 of U1, which is the "enable" pin for U1. The driver board circuitry of FIG. 2 can be turned on and off by means of logic level signals at pin 10.

U1 outputs an oscillating ultrasonic signal at pin 3. This output at pin 3 of U1 enters U2 at pin 10 to drive the input of a counter in U2. Pins 2 and 12 of U2 output signals that are divided signals of the input received at pin 10 of U2. These outputs at pins 2 and 12 of U2 are fed back into U1 at the pin connections shown. Pin 1 of U1 is the input for the amplitude modulation signal. Pins 14 and 11 of U1 are outputs.

With the connections shown, U1 outputs a signal with a center frequency at approximately 40 kHz. Because the output of pin 12 of U2 is fed back into pin 1 of U1, the amplitude of the base-band approximately 40 kHz signal of U1 is modulated within a square-wave envelope or packet having a frequency at approximately 160 Hz. The 40 kHz base-band signal itself is a square-wave signal. This signal has an amplitude that can have a maximum only when the modulation envelope is at the high modulation value. This signal drops immediately to zero when the square-wave modulation signal is at zero amplitude. This pattern of square-waves is repeated to provide a square-wave envelope amplitude modulation. A modulation frequency of 160 Hz has been found to be an optimum frequency for cleaning effectiveness for the illustrated ultrasonic cleaner.

In addition, because the output of pin 2 of U1 is fed back into pin 6 of U1, the frequency of the base-band 40 kHz signal is also modulated. However, rather than being modulated smoothly from a high to a low frequency about this center 40 kHz value, the frequency is "stepped" or "hopped" discontinuously among various frequencies around the transducers, resonant frequency. R11 may be "tuned" to achieve a center frequency providing for maximum sonic activity for the transducers. The illustrated cleaner thus provides for a variable center frequency for the ultrasonic signal.

Both the amplitude modulation signal emitted from pin 12 of U2 and the frequency modulation signal emitted from pin 2 of U2 are synchronous with the oscillation frequency emitted from pin 3 of U1. The frequency of the oscillator within U1 is modulated by the signal received at pin 6 from U2. However, the signal received at pin 6 is derived by U2 from the oscillation frequency of U1. Thus, as the oscillation frequency of U1 is modulated, the frequency modulation signal emitted from U2 at pin 12 is changed, further modifying the oscillation frequency of U1, etc. This interplay between U1 and U2 produces a frequency "hopping" about the center frequency that is somewhat random, or "pseudo random." This interplay does not, however, significantly affect the "square" nature of the amplitude modulation signal emitted at pin 12 of U2.

Driver circuit 34 includes transistors Q4, Q5, Q6, and Q7. These transistors, along with their associated diodes, resistors, and capacitors, drive transistors Q1 and Q2 to switch on and off. This driver circuit is isolated from the switching circuit by means of transformer T2. T1, T2, and T3 provide isolation from the AC line to reduce AC current leakage and prevent breakdown. T1 is a low frequency 60 Hz transformer. T2 and T3 are high frequency transformers, operating at ultrasonic frequencies.

It has been found that ultrasonic cleaners of the present invention provide significantly increased efficiency of cleaning. For example, previously known ultrasonic cleaners with a 3 liter liquid bath require approximately 127 watts of power for effective cleaning. However, with ultrasonic cleaners of the invention such as those described, effective cleaning can be achieved in a 6 to 7 liter bath with a power use of 140 watts.

One reason for the increased efficiency is that the frequency of the modulation signal can be selected to optimize cleaning efficiency. The frequency of the modulation signal is derived independent of the frequency of the AC line voltage. The frequency of the modulation signal can be chosen to optimize cleaning based on the type of items being cleaned.

It is believed that another reason for the increase in efficiency is that the square-wave modulation envelope provides a "harder" pulse of cleaning at the leading and trailing edge of each envelope packet. In addition, in terms of frequency modulation, the "stepping" or "hopping" of the frequency among various values about the center frequency is believed to provide more effective cleaning than smoothly varying the frequency about the center frequency.

Reference herein to details of the illustrated embodiment is not intended to limit the scope of the appended claims, which themselves recite those features regarded important to the invention.

I claim:

1. An ultrasonic cleaner powered by AC line voltage, comprising:
   - a tank adapted to receive liquid and articles to be cleaned;
   - a transducer mounted to said tank and adapted to provide ultrasonic vibrations to said liquid based upon an ultrasonic signal;
   - an oscillator linked with said transducer and adapted to produce an ultrasonic signal at a center frequency;
   - amplitude modulation means linked with said oscillator for modulating the amplitude of said ultrasonic signal at a modulation frequency independent of any AC line frequency; and
   - frequency modulation means linked with said oscillator for modulating the frequency of said ultrasonic signal about said center frequency.

2. An ultrasonic cleaner according to claim 1 wherein said amplitude modulation means produces a square-wave envelope signal within which said ultrasonic signal is modulated.

3. An ultrasonic cleaner according to claim 2 wherein the frequency of said envelope signal is synchronous with the frequency of said ultrasonic signal.

4. An ultrasonic cleaner according to claim 1 wherein said frequency modulation means is adapted to step the frequency of said ultrasonic signal between discrete frequencies about said center frequency.

5. An ultrasonic cleaner according to claim 4 wherein said ultrasonic signal is a square-wave signal.

6. An ultrasonic cleaner according to claim 1 wherein said cleaner is isolated from said AC line voltage by means of high frequency transformers.

7. A drive circuit for driving a transducer in an ultrasonic cleaner powered by AC line voltage, comprising:
   - an oscillator adapted to produce an ultrasonic signal at a preselected center frequency;
   - amplitude modulation means linked with said oscillator for modulating the amplitude of said ultrasonic signal within an amplitude envelope signal having a frequency independent of AC line frequency; and
   - a frequency control means linked with said oscillator for stepping said ultrasonic frequency between discrete frequencies about said center frequency.

8. A drive circuit according to claim 7 wherein said envelope signal is a square-wave signal.

9. A drive circuit according to claim 8 wherein said amplitude modulation means is a counter.

10. A drive circuit according to claim 7 wherein said frequency control means is a counter adapted to produce a frequency modulation signal and to deliver said frequency modulation signal to said oscillator.

11. A drive circuit according to claim 7 wherein said ultrasonic signal is a square-wave signal.

12. A drive circuit for an ultrasonic cleaner being powered by AC line voltage, comprising:
   - an oscillator adapted to produce an ultrasonic signal at a preselected center frequency;
   - a first counter linked with said oscillator and adapted to produce an amplitude envelope signal independent of any AC line frequency and to modulate the amplitude of said oscillator within said amplitude envelope signal;
   - a second counter linked with said oscillator to produce a frequency modulation signal independent of AC line frequency and to step said ultrasonic signal at discrete frequencies about said center frequency.

13. A drive circuit according to claim 12 wherein said first counter is adapted to divide said ultrasonic signal to produce said amplitude envelope signal.

14. A drive circuit according to claim 13 wherein said amplitude envelope signal is a square-wave signal.

15. A drive circuit according to claim 14 wherein said second counter is adapted to divide said ultrasonic signal to produce said frequency modulation signal.

16. A drive circuit according to claim 15 wherein said ultrasonic signal is a square-wave signal.

17. A drive circuit according to claim 12 wherein said drive circuit is adapted to operate at a plurality of user-selected voltages for said AC line voltage.

18. A drive circuit according to claim 12 further comprising adjustment means associated with said oscillator for varying the frequency of said center frequency.

* * * * *